United States Patent
Weekamp et al.

(10) Patent No.: US 8,661,655 B2
(45) Date of Patent: Mar. 4, 2014

(54) METHOD SUITABLE FOR TRANSFERRING A COMPONENT SUPPORTED BY A CARRIER TO A DESIRED POSITION ON A SUBSTRATE, AND A DEVICE DESIGNED FOR THIS

(75) Inventors: Johannus Wilhelmus Weekamp, Eindhoven (NL); Marc Andre De Samber, Eindhoven (NL); Johan Bosman, Eindhoven (NL); Willem Hoving, Eindoven (NL); Renatus Hendricus Maria Sanders, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 1605 days.

(21) Appl. No.: 10/515,470

(22) PCT Filed: May 8, 2003

(86) PCT No.: PCT/IB03/01909
§ 371 (c)(1),
(2), (4) Date: Nov. 22, 2004

(87) PCT Pub. No.: WO03/101171
PCT Pub. Date: Dec. 4, 2003

(65) Prior Publication Data
US 2006/0081572 A1    Apr. 20, 2006

(30) Foreign Application Priority Data
May 24, 2002    (EP) .................................. 02077043

(51) Int. Cl.
*H05K 3/30*    (2006.01)
*H05K 3/32*    (2006.01)

(52) U.S. Cl.
USPC ......... 29/739; 29/832; 156/379.6; 156/379.8; 414/416.09; 414/800; 221/74; 221/79

(58) Field of Classification Search
CPC ....................................................... H05K 3/30
USPC ............... 219/121.6, 121.65, 121.66, 121.85; 29/831, 832, 840, 739, 740, 741; 414/800, 416.09, 416.01; 221/74, 79; 156/379.6, 379.8, 539, 750; 198/793
See application file for complete search history.

(56) References Cited

U.S. PATENT DOCUMENTS 3,937,386 A * 2/1976 Hartleroad et al. ...... 228/180.21
3,993,508 A * 11/1976 Erlichman .................. 29/623.2
(Continued)

FOREIGN PATENT DOCUMENTS

| | | |
|---|---|---|
| EP | 0431637 A | 6/1991 |
| JP | 6153798 A | 3/1986 |

(Continued)

*Primary Examiner* — Samuel M Heinrich

(57) ABSTRACT

A method for transferring an electronic component supported by a carrier to a desired position on a substrate include moving the carrier supporting the component relative to the substrate while the component is present on a side of the carrier facing towards the substrate, with the component is positioned opposite the desired position on the substrate. Then, a light beam is directed at the carrier, at the location of the component, from a side remote from the substrate, as a result of which a connection between the component and the carrier is broken and the component is transferred from the carrier to the substrate.

12 Claims, 6 Drawing Sheets

(56) References Cited

U.S. PATENT DOCUMENTS

| | | | |
|---|---|---|---|
| 4,587,395 A * | 5/1986 | Oakley et al. | 219/121.64 |
| 4,822,445 A * | 4/1989 | Yamaguchi | 156/510 |
| 4,961,804 A * | 10/1990 | Aurichio | 156/248 |
| 4,978,835 A * | 12/1990 | Luijtjes et al. | 219/121.64 |
| 5,049,434 A * | 9/1991 | Wasulko | 428/202 |
| 5,055,652 A * | 10/1991 | Jones et al. | 219/121.64 |
| 5,091,770 A * | 2/1992 | Yamaguchi | 257/701 |
| 5,098,008 A * | 3/1992 | Viza et al. | 228/180.21 |
| 5,300,172 A * | 4/1994 | Ishiwata et al. | 156/275.5 |
| 5,338,360 A * | 8/1994 | Nilsson | 118/602 |
| 5,435,876 A * | 7/1995 | Alfaro et al. | 156/247 |
| 5,454,900 A * | 10/1995 | Han et al. | 156/584 |
| 5,525,422 A * | 6/1996 | Spies et al. | 428/355 AC |
| 5,534,466 A * | 7/1996 | Perfecto et al. | 216/20 |
| 5,637,395 A | 6/1997 | Uemura et al. | |
| 5,644,837 A * | 7/1997 | Fathi et al. | 29/832 |
| 5,847,356 A * | 12/1998 | Santhanam | 219/121.64 |
| 5,941,674 A | 8/1999 | Briehl | 414/417 |
| 5,998,129 A * | 12/1999 | Schutze et al. | 435/4 |
| 6,319,754 B1 | 11/2001 | Wang et al. | 438/113 |
| 6,319,828 B1 * | 11/2001 | Jeong et al. | 438/674 |
| 6,555,417 B2 * | 4/2003 | Spooner et al. | 438/113 |
| 6,638,865 B2 * | 10/2003 | Tanaka | 438/692 |
| 6,682,702 B2 * | 1/2004 | Barth et al. | 422/102 |
| 6,803,245 B2 * | 10/2004 | Auch et al. | 438/26 |
| 6,907,798 B2 * | 6/2005 | Ganser et al. | 73/864.41 |
| 6,945,299 B2 * | 9/2005 | Onodera et al. | 156/539 |
| 6,972,204 B2 * | 12/2005 | Oohata et al. | 438/22 |
| 6,983,539 B2 * | 1/2006 | Akhavain et al. | 29/890.1 |
| 7,226,812 B2 * | 6/2007 | Lu et al. | 438/114 |
| 7,318,999 B2 * | 1/2008 | Schutze | 435/4 |
| 2002/0084521 A1 * | 7/2002 | Coyle et al. | 257/690 |
| 2002/0121681 A1 * | 9/2002 | Wyant et al. | 257/668 |
| 2003/0034120 A1 * | 2/2003 | Yanagisawa et al. | 156/238 |
| 2003/0178395 A1 * | 9/2003 | Duignan | 219/121.68 |
| 2003/0201524 A1 * | 10/2003 | Murakami et al. | 257/686 |
| 2004/0089408 A1 * | 5/2004 | Brod et al. | 156/230 |
| 2004/0148767 A1 * | 8/2004 | Mehdianpour et al. | 29/832 |
| 2004/0252291 A1 * | 12/2004 | Schutze | 356/36 |

FOREIGN PATENT DOCUMENTS

| | | | |
|---|---|---|---|
| JP | 402238648 A * | 9/1990 | |
| JP | 404033400 A * | 2/1992 | |
| JP | 406112244 A * | 4/1994 | |
| JP | H1070151 A | 3/1998 | |
| JP | 411129485 A * | 5/1999 | |
| JP | 02002023127 A * | 1/2002 | |
| JP | 2003133708 A | 5/2003 | |

* cited by examiner

METHOD SUITABLE FOR TRANSFERRING A COMPONENT SUPPORTED BY A CARRIER TO A DESIRED POSITION ON A SUBSTRATE, AND A DEVICE DESIGNED FOR THIS

The invention relates to a method suitable for transferring a component supported by a carrier to a desired position on a substrate.

The invention also relates to a device suitable for transferring a component supported by a carrier to a desired position on a substrate, which device is provided with a carrier transport device and with a substrate transport device.

In such a method known from U.S. Pat. No. 5,941,674, electronic components are located in compartments provided in a carrier. The carrier is moved to a pick-up position, where an ejector pin is moved upwards through a compartment, such that the component is lifted from the carrier. Simultaneously, a pick-up element is moved towards the component from a side of the carrier remote from the pin, such that the component is picked up by said element by means of vacuum. The component is then moved to a desired position on a substrate by the pick-up element.

Such a method is suitable for components whose length and/or width are greater than approximately 0.25 mm and whose thickness is greater than, for example, 70 Fm.

Developments are ongoing relating to the use of components which are considerably smaller than the dimensions given above. Such components can no longer be lifted by a pin. Besides, picking-up of such components by means of vacuum is substantially impossible because a vacuum tube situated in the pick-up element should have a diameter which is smaller than the component to be picked up. Such a vacuum tube tends to get blocked up comparatively quickly.

The invention has for its object to provide a method by means of which such comparatively small components can be accurately positioned in a desired location.

This object is achieved in the method according to the invention in that the carrier supporting the component, with the component situated at a side of the carrier facing the substrate, is displaced with respect to the substrate until the component is located opposite the desired position on the substrate, whereupon a light beam is aimed at the carrier at the area of the component such that a connection between the component and the carrier is broken and the component is transferred from the carrier to the substrate.

In such a method, in which the components are fastened to the carrier, the light beam provides energy in the carrier, by means of which the fastening is broken and the component is as it were propelled towards the substrate. The electronic component is positioned thereby on the electrically conducting contacts present on the substrate.

The component may be fastened to the carrier in this case by means of an intermediate layer, for example formed by infrared dyes, polymers such as polyimide, PMMA, PET, PEN, PVC, a thin metal layer, amorphous Si with more than 2% atomic weight of hydrogen, etc.

The direct transfer of the component from the carrier to the substrate by means of a light beam means that the component need not be mechanically gripped anymore, so that damage to the component is avoided. In addition, this method ensures that the component is not only placed in the correct position on the substrate, but in addition is provided on the substrate in a desired orientation. If the component is picked up by mechanical means, there is a risk in the case of comparatively small components that the component performs a slight rotation during picking-up and/or displacing of the component by means of the pick-up element, and the component is accordingly placed on the substrate with an incorrect orientation.

An embodiment of the method according to the invention is characterized in that the light beam is excited by means of an Nd-YAG laser, $CO_2$ laser, diode laser, or excimer laser.

A light beam with a sufficiently small diameter can be directed at the carrier in a simple manner by means of such a laser. In addition, such a light beam can be switched on and off in a simple manner with comparatively short time cycles, while nevertheless sufficient energy can be introduced into the carrier by the light beam within a single time cycle.

A further embodiment of the method according to the invention is characterized in that the carrier supporting the component is displaced in a first horizontal direction, while the substrate situated below the carrier is displaced in a second horizontal direction perpendicular to the first horizontal direction, until the component is positioned opposite the desired position on the substrate.

The displacement of the carrier in a first horizontal direction and the displacement of the substrate in a second horizontal direction transverse thereto renders it possible to position a component above any desired position on the substrate in a simple manner.

A yet further embodiment of the method according to the invention is characterized in that a number of components is simultaneously transferred from the carrier to the single substrate or to a number of substrates by means of a number of light beams.

A large number of components can be positioned on substrates comparatively quickly in this manner.

The components positioned on a substrate may be connected to the substrate and the electrical contacts present thereon by means of soldering, laser welding, an electrically conductive glue, an electrically conductive epoxy resin, or some other metal-based or electrical connection technique.

After being provided one by one in pairs on the desired positions of the substrate, the components may thus be simultaneously connected to the substrates in a comparatively short time. An electrical contact between the substrate and the component is realized thereby at the same time.

The invention also has for its object to provide a device by means of which the disadvantages of the known device are avoided.

This object is achieved in the device according to the invention in that the device is further provided with an illumination device which is situated at least partly at a side of the carrier transport device facing away from the substrate transport device, wherein during operation a carrier which supports components can be positioned relative to a substrate supported by the substrate transport device by means of the carrier transport device and the substrate transport device, while a light beam can be directed at the carrier by the illumination device.

The device according to the invention renders it possible to position comparatively small component accurately in a desired location on the substrate without mechanical contact.

The invention will now be explained in more detail below with reference to the drawings in which:

FIG. 1 shows a substrate 1 on which a number of components 2 have already been provided.

A carrier 3 extends above the substrate 1 at a comparatively short distance therefrom and parallel thereto. The carrier 3 is provided with components 2 at its side facing the substrate 1, which components have mutual interspacings which are substantially smaller than the interspacings of the components 2 transferred to the substrate 1. The distance between the substrate 1 and a component to be transferred thereto is, for example 50 μm.

Figure 1:
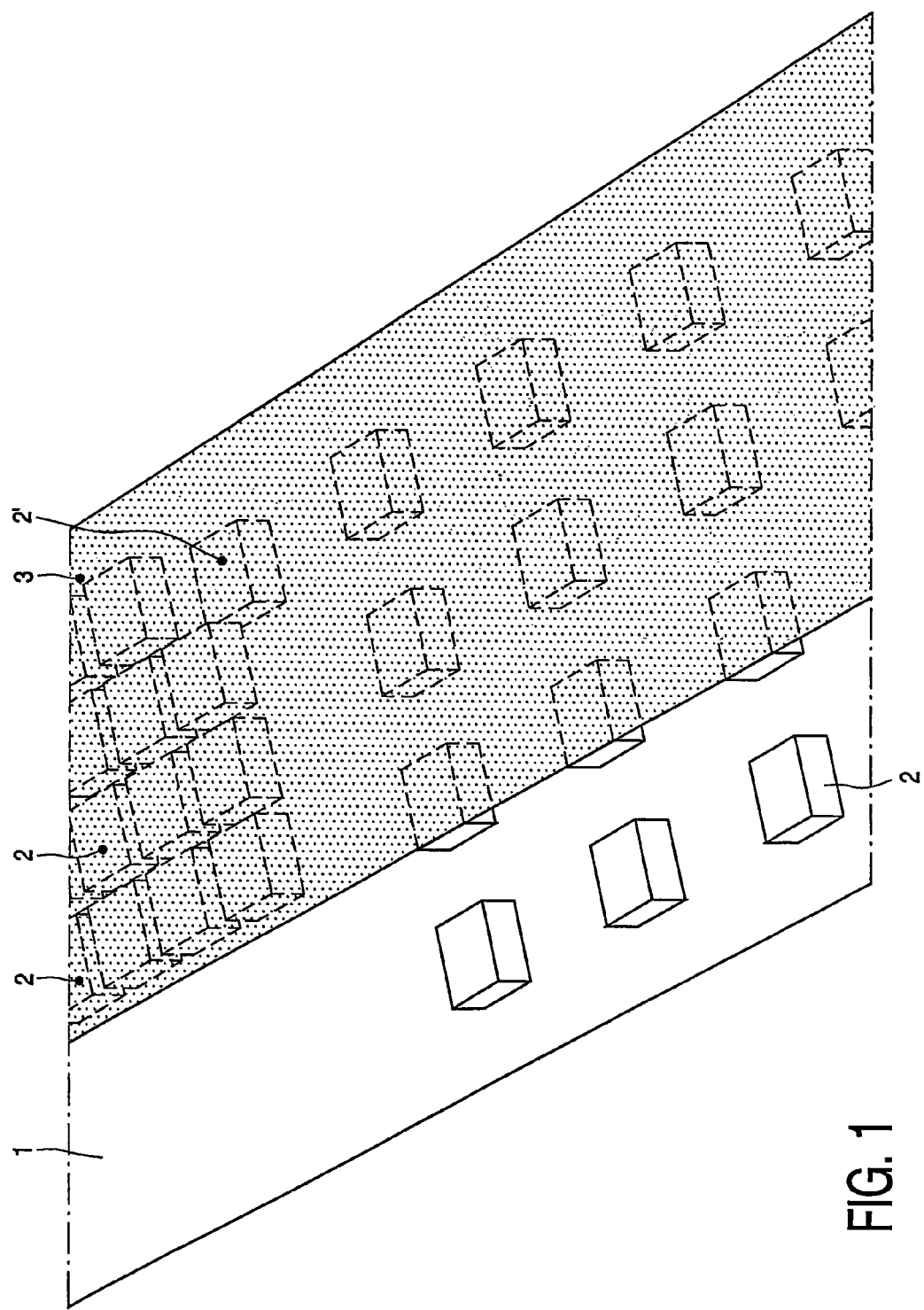
FIGS. 1 to 5 are perspective views of consecutive steps in transferring a component from a carrier to a substrate.

In the situation shown in FIG. 1, the component 2' has just been transferred from the carrier 2 to the substrate 1.

Starting from the situation shown in FIG. 1, the carrier 3 is displaced in a direction indicated by arrow P1 by a carrier transport device (not shown). The direction indicated by arrow P1 extends parallel to the surface of the substrate 1 and transversely to the longitudinal direction of the substrate 1. The carrier 3 is displaced in the direction of arrow P1 until a component 2" is present in a desired position above the substrate 1.

Figure 3:
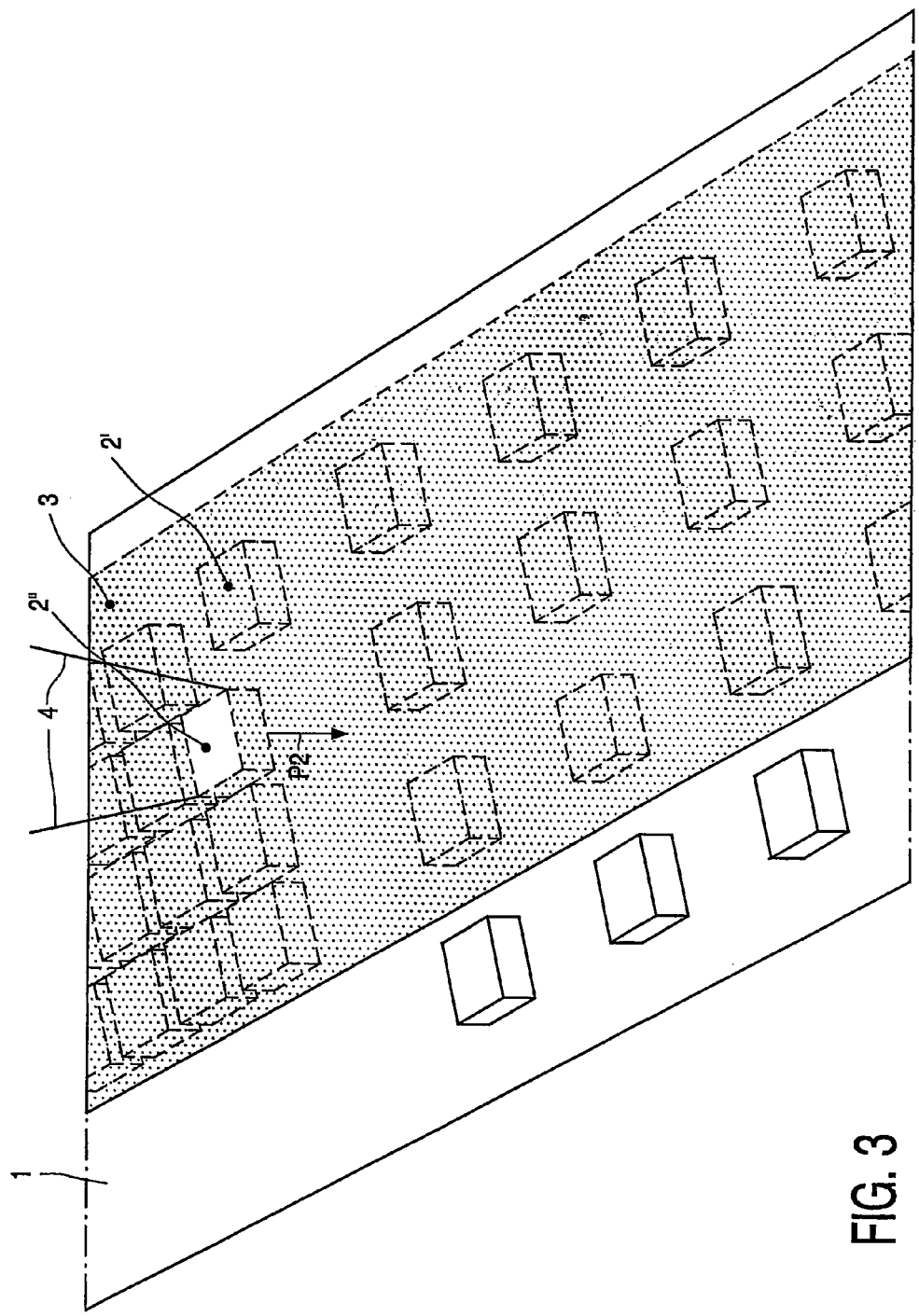

At that moment a light beam 4 is directed at the carrier 3 in the location of the component 2" by an Nd-YAG laser from a side facing away from the substrate 1, so that a connecting layer 5 (FIG. 6C) present between the component 2" and the carrier 3 is heated, and the component 2" is displaced from the carrier 3 in a direction indicated by arrow P2 towards the substrate 1 (see FIG. 3). This displacement is caused by propulsion in the case of a polymeric intermediate layer 5, by a build-up of pressure owing to ablation in the case of a metal intermediate layer 5, and by a build-up of pressure owing to the release of hydrogen after illumination in the case of an intermediate layer 5 of amorphous Si with >2% H.

Figure 2:
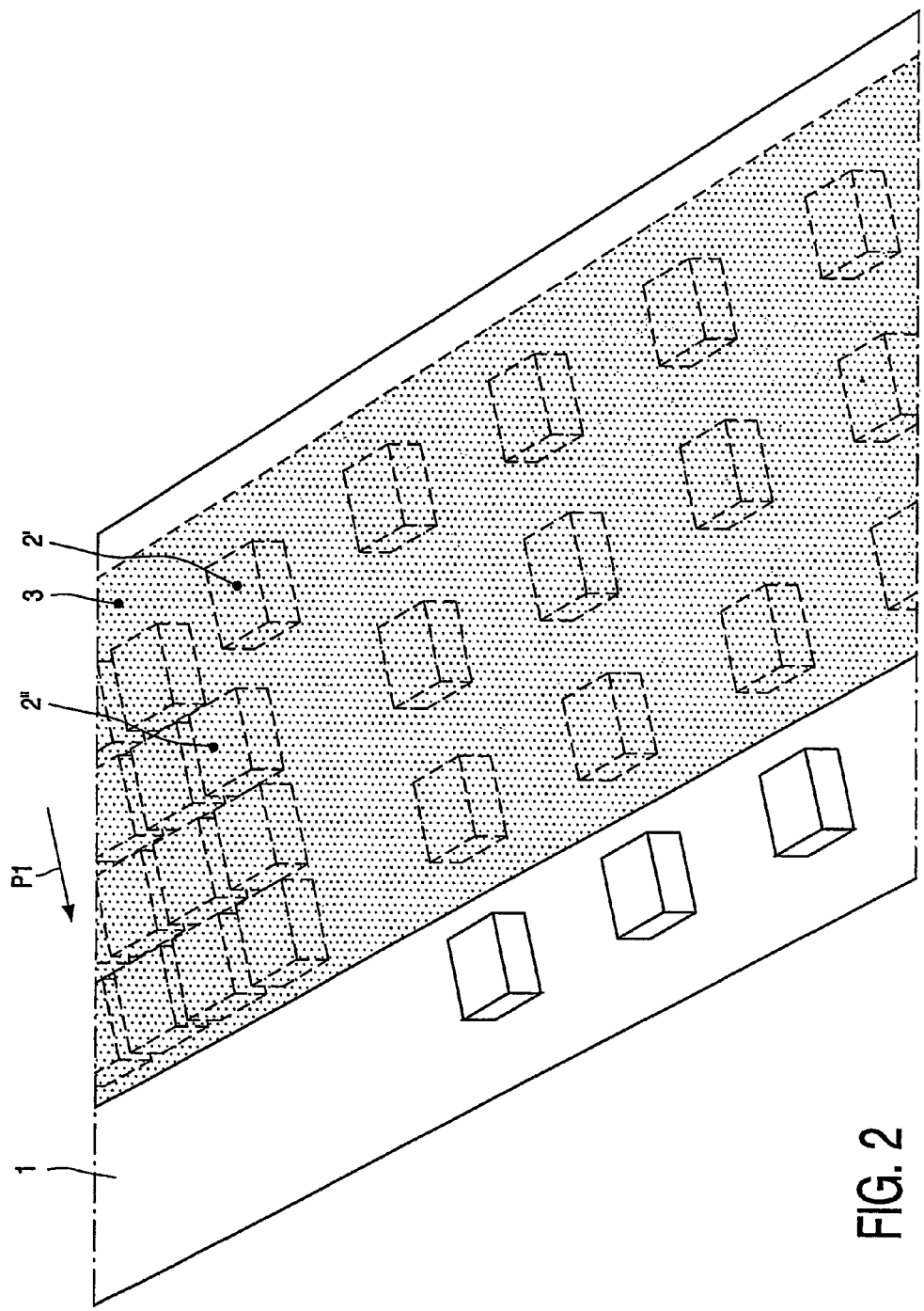
Figure 4:
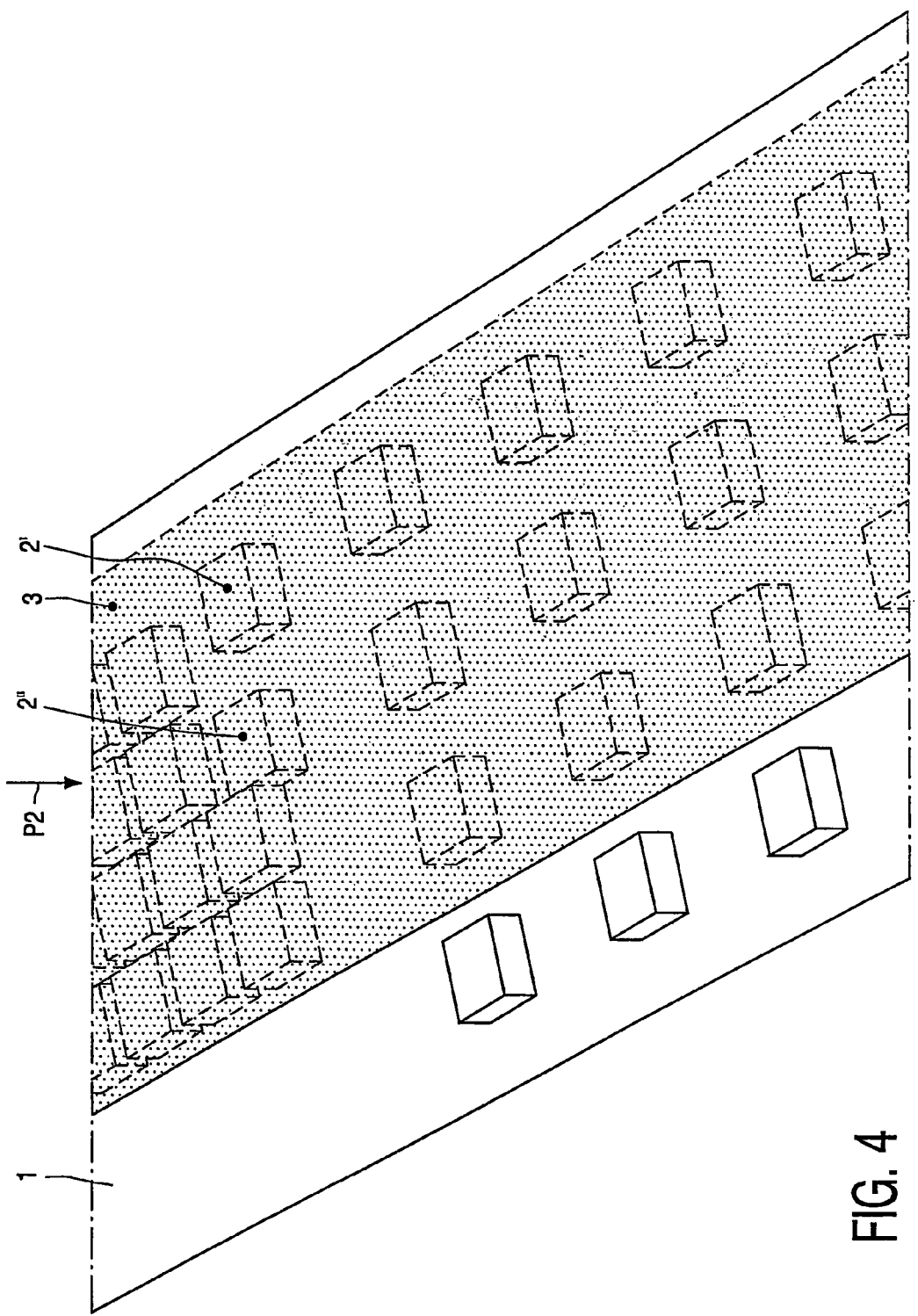

After switching-off of the light beam 4, the component 2" will lie on the substrate 1 (see FIG. 4). The carrier is then moved in the direction of arrow P1 again, as was described with reference to FIG. 2, until a component 2" to be transferred is present above a desired position on the substrate 1.

Figure 5:
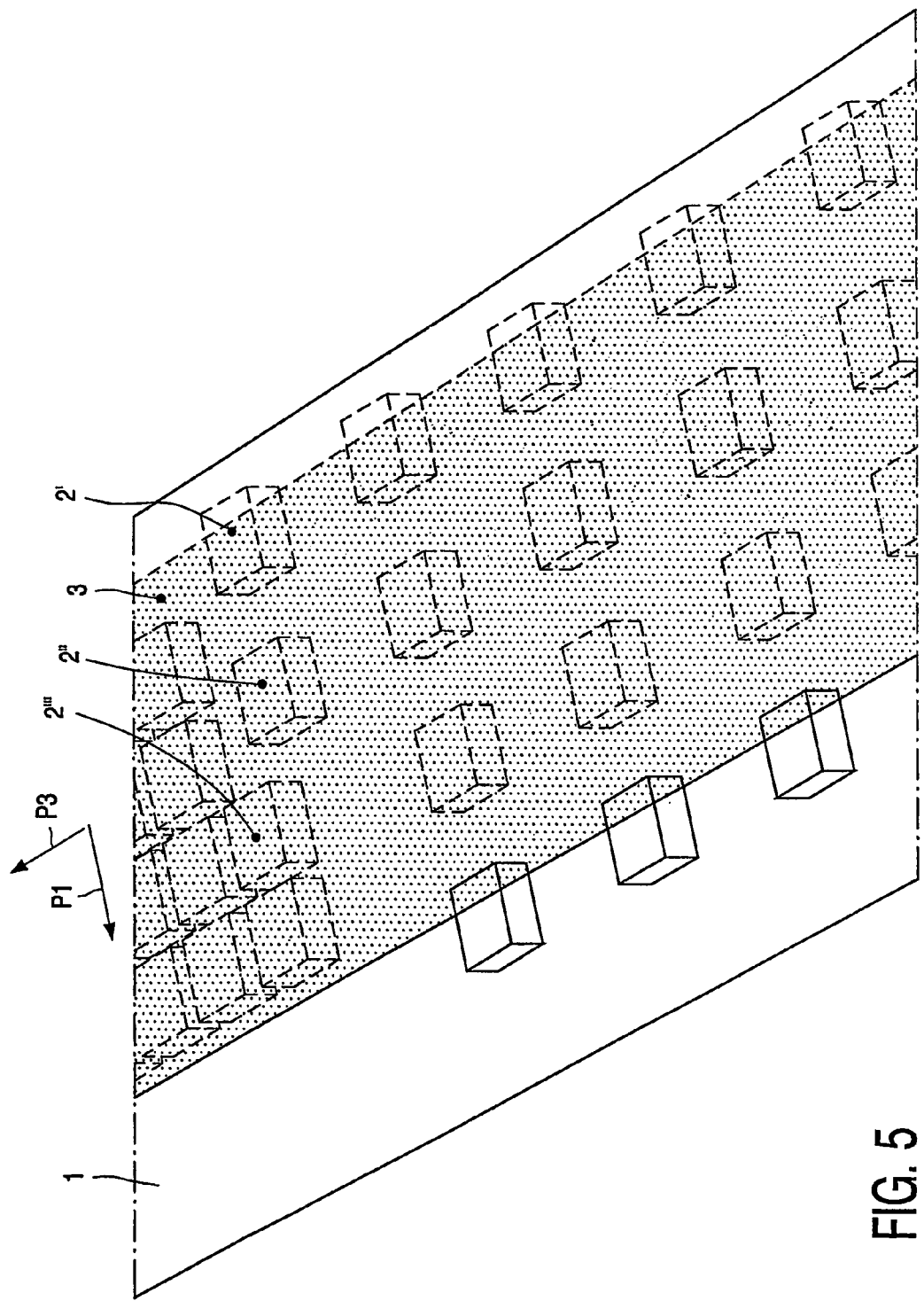

Four components 2 are situated next to one another in the direction of arrow P1 in the carrier 3, as shown in FIG. 5. After such a row of four components 2 has been transferred to the substrate 1, the carrier transport device will displace the carrier 3 in the direction indicated by arrow P3.

Figure 6A:
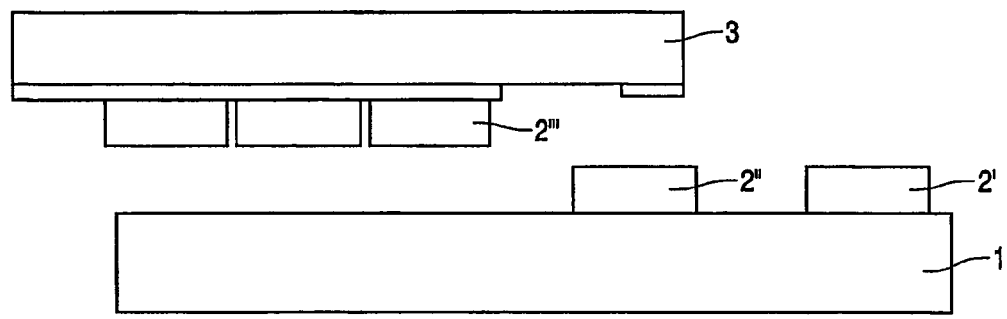
FIGS. 6A to 6C are side elevations of a number of steps in transferring a component from a carrier to a substrate.
Figure 6B:
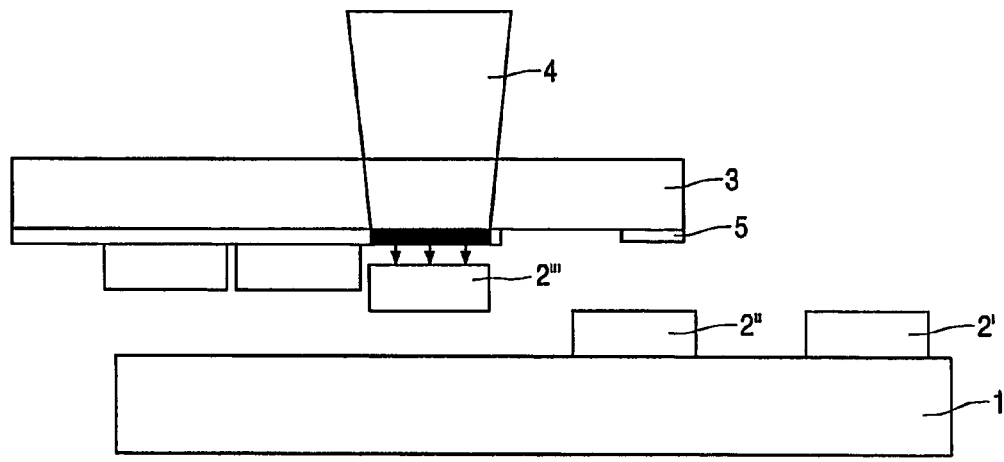
Figure 6C:
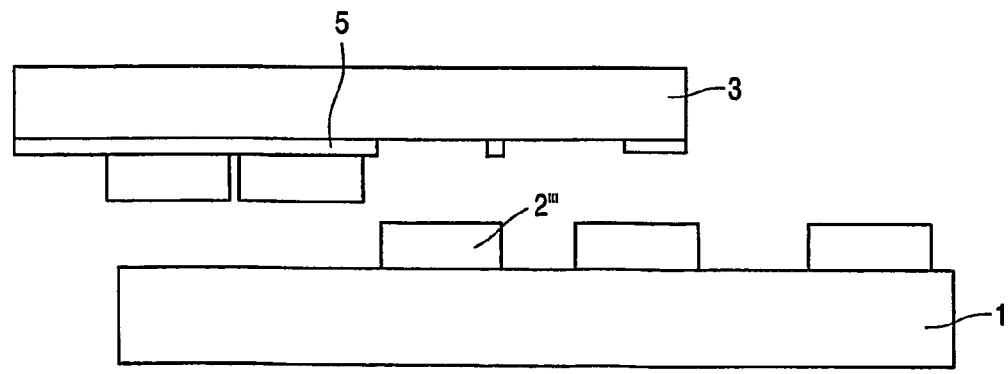

FIGS. 6A to 6C are side elevations of a number of steps in the transferring of a component 2" to a carrier substrate 1. The component 2''' is connected to the carrier means of a connecting layer 5. In the situation shown in FIG. 6A, the component 2''' present above the desired position on the substrate 1. In the situation shown in FIG. 6B, the connecting layer 5 is activated by the laser beam 4 such that it drives way the component 2''', displacing it in the direction of the substrate 1 in the situation shown in FIG. 6G. As is apparent from FIG. 6C, the intermediate layer 5 has also been removed at the area of the carrier 3 where the component 2''' was removed. As is apparent from FIG. 6B, the size of the intermediate layer 5 to be removed in one dimension, such as the horizontal dimension shown as a black horizontal bar in FIG. 6B where the intermediate layer 5 is being removed from an area of the carrier 3, is the same size in this dimension of the component 2''', namely, in the horizontal dimension of the component 2''' shown in FIG. 6B.

It is also possible to displace the substrate 1 by means of a substrate transport device (not shown) in and opposite to the direction of arrow P1 and in and opposite to the direction of arrow P3.

It is obvious that it is alternatively possible to provide only one component 2 on a substrate 1, whereupon a different substrate 1 is positioned below the carrier 3. It is also possible to provide the substrate 1 with a number of sub-substrates which are separated from one another after the components 2 have been provided.

It is furthermore possible to displace the carrier 3 and/or the substrate 1 both in the directions indicated by arrow P1 and in those indicated by arrow P3 during positioning.

After the components 2 have been provided on the substrate 1, the components are connected to the substrate 1 by means of soldering, an electrically conductive glue, an electrically conductive epoxy resin, or laser welding.

It is also possible to stack components by the method according to the invention, whereby a 3D construction is obtained.

It is also possible to have the laser beam radiate through the substrate instead of from a side facing away from the substrate. This is possible, for example, if the substrate on which the components are placed is transparent.

The invention claimed is:

1. A method for transferring a component supported by a carrier to a desired position on a substrate, the method comprising the acts of:

attaching the component to the carrier using an intermediate layer located between the component and the carrier, displacing the carrier supporting the component with respect to the substrate, with the component situated at a side of the carrier facing the substrate, until the component is located opposite the desired position on the substrate, aiming a light beam at the carrier at an area of the carrier were the component is attached to the carrier such that a connection between the component and the carrier is broken and the component is propelled by a build-up of pressure, a least in part, by interaction of the light beam and the carrier when the component is transferred from the carrier to the substrate, and removing the intermediate layer from the component and from the area of the carrier where the component was removed, wherein a size of the intermediate layer in one dimension removed from the area of the carrier is a same size in the one dimension of the component.

2. The method as claimed in claim 1, wherein the light, beam is excited by means of an Nd-YAG laser, CO2 laser, diode laser, or excimer laser.

3. The method as claimed in claim 1, wherein the carrier supporting the component displaced in a first horizontal direction, while the substrate situated below the carrier is displaced in a second horizontal direction perpendicular to the first horizontal direction, until the component is positioned opposite the desired position on the substrate.

4. The method as claimed in claim 1, wherein a number of components is simultaneously transferred from the carrier to the single substrate or to a number of substrates by means of a number of light beams.

5. The method as claimed in claim 1, wherein the component, after being transferred to the substrate, is connected to the substrate by means of soldering or laser welding.

6. The method as claimed in claim 1, wherein the component, after being transferred to the substrate, is connected the substrate by means of an electrically conductive glue.

7. The method as claimed in claim 1, wherein the component after being transferred to the substrate, is connected to the substrate by means of an electrically conductive epoxy resin.

8. The method as claimed in claim 1, wherein the light beam is provided from a side of the carrier facing away from the substrate.

9. The method as claim in claim 1, wherein the light beam is provided through the substrate, from a side of the substrate facing away from the carrier.

10. A device for transferring a component supported by a carrier to a desired position on a substrate, the device comprising:

a carrier transport device configured to support a carrier, the carrier supporting component attached to the carrier using an intermediate layer located between the component and the carrier;

a substrate transport device configured to support a substrate; and an illumination device which is situated at least partly at a side of the carrier transport device facing away from the substrate transport device, wherein, during operation, the carrier is positioned relative to the to the substrate by movement of the carrier transport device relative to the substrate transport device, wherein a light beam is directed at an area of the carrier by the illumination device and the component is removed from the carrier and propelled towards the substrate by a build-up of pressure, at least in part by interaction of the light beam and the carrier, and wherein the intermediate layer is removed from the component and from the area of the carrier where the component was removed, wherein a size in one dimension of the intermediate layer removed from the area of the carrier is same size in the one dimension of the component.

11. The device as claimed in claim 10, wherein the llumination device is a laser.

12. The device of claim 10 wherein, after removal of the component and removed portions of the intermediate layer from the carrier, the carrier includes remaining portions the intermediate layer adjacent to the area of the carrier.

* * * * *